US006541085B2

(12) United States Patent
Isobe et al.

(10) Patent No.: US 6,541,085 B2
(45) Date of Patent: Apr. 1, 2003

(54) TUBULAR MOLDED PRODUCT USING NYLON 12

(75) Inventors: Noriyuki Isobe, Yamaguchi (JP); Tetsuji Hirano, Yamaguchi (JP); Kouichiro Kurachi, Yamaguchi (JP); Nobuhiro Ogawa, Yamaguchi (JP)

(73) Assignee: Ube Industries, Ltd., Yamaguchi (JP)

( * ) Notice: Subject to any disclaimer, the term of this patent is extended or adjusted under 35 U.S.C. 154(b) by 0 days.

(21) Appl. No.: 09/923,979

(22) Filed: Aug. 7, 2001

(65) Prior Publication Data

US 2002/0010306 A1 Jan. 24, 2002

Related U.S. Application Data

(62) Division of application No. 09/262,225, filed on Mar. 4, 1999, now Pat. No. 6,294,644.

(30) Foreign Application Priority Data

| Mar. 6, 1998 | (JP) | 10-055173 |
| Apr. 3, 1998 | (JP) | 10-91491 |
| Dec. 28, 1998 | (JP) | 10-372418 |
| Jan. 11, 1999 | (JP) | 11-003831 |

(51) Int. Cl.$^7$ .................. B29D 22/00; B29D 23/00; C08L 77/00; B32B 1/08
(52) U.S. Cl. .................. 428/34.1; 428/36.9; 525/66; 525/179
(58) Field of Search .................. 428/34.1, 36.9; 525/66, 179

(56) References Cited

U.S. PATENT DOCUMENTS 5,147,931 A * 9/1992 Sakuma et al. .................. 525/66
5,789,529 A * 8/1998 Matsumura et al. ......... 528/310

FOREIGN PATENT DOCUMENTS

| EP | 0 530 592 A2 | 3/1993 |
| JP | A-7-278294 | * 4/1994 |
| JP | A-8-325451 | * 5/1995 |
| JP | 07-278294 A | 10/1995 |

OTHER PUBLICATIONS

"Anticorrosion coatings with polypropylene" G.L. Rigosi et al Polypropylene: An A–Z Reference, 1999, Kluwer Academic Publishers.*

* cited by examiner

Primary Examiner—P. Hampton-Hightower
(74) Attorney, Agent, or Firm—Akin Gump Strauss Hauer & Feld, L.L.P.

(57) ABSTRACT

Disclosed is a member of nylon 12 having a relative viscosity of from 1.9 to 3.5 when measured in 98% sulfuric acid at a concentration of 10 g/dm$^3$ and at 25° C. and a melt flow rate of 0.1 g/10 min. or more when measured at 235° C. under a load of 2,160 g, wherein said relative viscosity and said melt flow rate have a relationship of the following formula (I):

$$2.87 \times 10^3 \exp(-3.48\, \eta_r) \leq MFR \leq 3.25 \times 10^4 \exp(-3.48\, \eta_r) \qquad (I)$$

wherein $\eta_r$ is relative viscosity and MFR is melt flow rate. The nylon 12 has excellent extrusion moldability and creep characteristics, fatigue characteristics and the like mechanical properties and is suited for tubular molds. A nylon 12 composition comprising the nylon 12 having the above-described specific relationship between $\eta_r$ and MFR and a plasticizer is also disclosed.

4 Claims, No Drawings

TUBULAR MOLDED PRODUCT USING NYLON 12

CROSS REFERENCE TO RELATED APPLICATIONS

This application is a division of application Ser. No. 09/262,225, filed Mar. 4, 1999 now U.S. Pat. No. 6,294,644, entitled "Nylon 12, Nylon 12 Composition, Method For Producing Nylon 12, And Tubular Molded Product Using Nylon 12", the entire disclosure of which is incorporated herein by reference.

FIELD OF THE INVENTION

This invention relates to a member of nylon 12 which is possessed of excellent extrusion moldability, as well as excellent creep characteristics and fatigue characteristics, and to a method for its production.

This invention relates to a nylon 12 composition which is possessed of excellent extrusion moldability and excellent flexibility, creep characteristics and low temperature impact strength. Said nylon 12 and said nylon 12 composition can be used for mainly extrusion molds such as tubular molds, sheet molds, and monofilaments, and is particularly suited for tubular molds.

BACKGROUND OF THE INVENTION

Since nylon 12 has high chemical resistance, heat resistance and dimensional stability at the time of water absorption, it has been used as a material for injection moldings and for extrusion molds such as tubes, sheets and films in various industrial fields. In recent years, development of the use of nylon 12 has been making progress in the field of tubular molds such as fuel tubes, various hoses for industrial use, and gas pipes, and characteristics of nylon 12 required in this field have been highly advanced and diversified. Particularly, a demand has been increasing for a material for use in tubes, which has good moldability and shows excellent durability under severe environment, namely a member of nylon 12 which is possessed of excellent extrusion moldability, as well as excellent creep characteristics and fatigue characteristics.

With regard to the improvement of moldability of nylon 12, JP-A-7-278294 (the term "JP-A" as used herein means an "unexamined published Japanese patent application"), for example, discloses a method for the production of a member of nylon 12 which has excellent melt fluidity and is suited for precision molding. This type of nylon 12 is characterized in that its relative viscosity (to be referred to as "$\eta_r$" hereinafter) and melt flow rate (to be referred to as "MFR" hereinafter) have a specific relationship. JP-A-7-278294 relates mainly to precision molding or the like injection molding. In general, injection molding shows a tendency in that the moldability becomes good as the melt fluidity of a polymer becomes superior, namely as the melt viscosity becomes low. In the case of the molding of tubes and the like extrusion moldings, however, too low melt viscosity causes a difficulty in obtaining tubular moldings having proper shapes because of the difficulty in keeping the tube shapes at the time of molding. Because of this, when the nylon 12 having superior melt fluidity disclosed in JP-A-7-278294 was used, there was limitation on molding conditions for obtaining proper tubular moldings. In order to produce good extrusion moldings stably, nylon 12 having a melt fluidity different from the case of injection molding was required. Because of this, development of nylon 12 suitable for extrusion molding is expected.

In addition, no prior art information is available concerning the improvement of creep characteristics and fatigue characteristics of nylon 12. It is said in general that the durability-related characteristics such as creep characteristics and fatigue characteristics of a polymer become excellent as its molecular weight is increased. There are some proposals concerning methods for increasing molecular weight of polyamide. For example, JP-A-3-97732 discloses a method in which a polyamide having relatively low molecular weight is mixed with a phosphorus compound under a melting condition and made into pellet, powder or the like shape and then its molecular weight is increased by solid phase polymerization. However, it is difficult to produce nylon 12 having a $\eta_r$ value of 5 or more even by the use of this method. Creep characteristics and fatigue characteristics of nylon 12 having a $\eta_r$ value of about 5 are not sufficient when compared with the intended values of the present invention. Also, being extremely low in melt fluidity, it was difficult to use nylon 12 having a $\eta_r$ value of 5 in extrusion molding. Because of this, concern has been directed toward the development of nylon 12 which has excellent extrusion moldability, creep characteristics and fatigue characteristics and is suitable as a tube material.

On the other hand, with the expansion of the range of their use, a demand has been increasing for nylon 12 which can be used under an environment where temperature changes widely or at a low temperature, e.g., −40° C. However, flexibility, low temperature impact strength, durability-related creep characteristics and the like properties of the prior art nylon 12 were not satisfactory for its use under such severe environment.

With regard to the method for improving flexibility and low temperature impact strength of nylon 12, proposals have been made for example on a composition which comprises nylon 12 and a plasticizer having good compatibility and a composition which comprises a polyamide resin, a plasticizer, a modified polyolefin and/or a thermoplastic elastomer.

With regard to the composition comprising a polyamide and a plasticizer, JP-A-62-283151, for example, discloses polyamide resin molds having flexibility which comprise nylon 12 and the like and 2-ethylhexyl-p-hydroxy benzoate as a plasticizer. Also, JP-A-1-185362 discloses a composition which comprises a polyamide resin and an ester as a plasticizer obtained from p-hydroxybenzoic acid and a branched alcohol having 12 to 22 carbon atoms.

However, according to these proposals, impact strength at a low temperature of for example −30° C. or below was not sufficient and the creep characteristics was also insufficient, though flexibility was improved.

Also, with regard to the composition comprising a polyamide resin, a plasticizer and a modified polyolefin, JP-A-5-320504 discloses a composition which comprises a nylon 12 resin, a modified polyolefin composed of an olefin mainly consisting of ethylene and/or propylene and an α,β-unsaturated carboxylic acid or a derivative thereof, and a plasticizer such as an ester synthesized for example from p-hydroxybenzoic acid and a branched alcohol having 12 to 22 carbon atoms. In addition, JP-A-8-325451 discloses tubular molds which comprise nylon 12, a modified polyolefin composed of an olefin mainly consisting of ethylene and/or propylene and an α,β-unsaturated carboxylic acid or a derivative thereof and a plasticizer. These proposed compositions were not satisfactory in terms of their creep characteristics, though their flexibility and low temperature impact strength were improved.

SUMMARY OF THE INVENTION

The object of the present invention is to provide a member of nylon 12 which is possessed of excellent extrusion moldability, as well as excellent creep characteristics and fatigue characteristics, and a method for its production.

Another object of the present invention is to provide a nylon 12 composition which has excellent flexibility, low temperature impact strength and creep characteristics.

The inventors of the present invention have examined in detail on the relationship between basic physical properties of nylon 12 and its extrusion moldability, creep characteristics and fatigue characteristics and found as a result of the efforts that a member of nylon 12 in which its relative viscosity ($\eta_r$) and melt flow rate (MFR) values have a specific relationship shows excellent extrusion moldability and its creep characteristics and fatigue characteristics become excellent too, thus resulting in the accomplishment of the present invention.

Moreover, the inventors of the present invention have examined in detail on the effects of physical properties of nylon 12 and kinds of plasticizer on the flexibility, low temperature impact strength and creep characteristics of nylon 12 and found as a result of the efforts that a composition prepared by adding a specified plasticizer and, as occasion demands, a modified polyolefin to nylon 12 in which its $\eta_r$ and MFR have a specific relationship can show excellent flexibility, low temperature impact strength and creep characteristics, thus resulting in the accomplishment of the present invention.

These objects of the present invention are accomplished by the following third aspects.

The first aspect of the present invention is a member of nylon 12 having a $\eta_r$ value of from 1.9 to 3.5 when measured in 98% sulfuric acid at a concentration of 10 g/dm$^3$ and at 25° C. and a MFR value of 0.1 g/10 min. or more when measured at 235° C. under a load of 2,160 g, wherein said $\eta_r$ value and said MFR value have a relationship of the following formula (I):

$$2.87 \times 10^3 \exp(-3.48\, \eta_r) \leq \text{MFR} \leq 3.25 \times 10^4 \exp(-3.48\, \eta_r) \quad (I)$$

wherein $\eta_r$ is relative viscosity and MFR is melt flow rate.

The second aspect of the present invention is a method for the production of the nylon 12 described as the first aspect, which comprises carrying out a pre-polymerization step under pressure melting condition and a subsequent post-polymerization step under ordinary pressure or a reduced pressure, wherein polymerization temperature of the pre-polymerization step is set within the range of from 270 to 320° C., and the polymerization temperature, pressure inside the polymerization system and polymerization time in the pre-polymerization step are controlled keeping a relationship of the following formula (II):

$$7.99 \times 10^5 \exp(-2.19 \times 10^{-2}\, T) \geq Pt \geq 5.64 \times 10^7 \exp(-4.24 \times 10^{-2}\, T) \quad (II)$$

wherein T is polymerization temperature and its unit is ° C., P is pressure inside the polymerization system and its unit is kgf/cm$^2$ G, and t is polymerization time and its unit is hour (hr).

The third aspect of the present invention is a nylon 12 composition which comprises (A) 100 parts by weight of nylon 12 having a $\eta_r$ value of from 1.9 to 3.5 when measured in 98% sulfuric acid at a concentration of 10 g/dm$^3$ and at 25° C. and a MFR value of 0.1 g/10 min. or more when measured at 235° C. under a load of 2,160 g, wherein said $\eta_r$ and said MFR have a relationship of the formula (I):

$$2.87 \times 10^3 \exp(-3.48\, \eta_r) \leq \text{MFR} \leq 3.25 \times 10^4 \exp(-3.48\, \eta_r) \quad (I)$$

wherein $\eta_r$ is relative viscosity and MFR is melt flow rate, (B) from 1 to 25 parts by weight of a plasticizer, and (C) from 0 to 30 parts by weight of a modified polyolefin obtained from an olefin consisting of ethylene and/or propylene as the main component and an $\alpha,\beta$-unsaturated carboxylic acid or a derivative thereof.

It is well known that $\eta_r$ and MFR of polymers are physical properties which exert influences upon moldability. However, nothing is known about the relationship between the $\eta_r$ and MFR values of nylon 12 and the extrusion moldability. In addition, it is not known that a member of nylon 12 having a specific relationship between $\eta_r$ and MFR is excellent in creep characteristics and fatigue characteristics, which was found for the first time by the present invention.

The present invention is characterized by the finding that a composition comprising nylon 12 having a specific relationship between its $\eta_r$ and MFR values and a plasticizer, or a composition in which a modified polyolefin is added to the former composition as occasion demands, has excellent flexibility, low temperature impact strength and creep characteristics.

DETAILED DESCRIPTION OF THE INVENTION

The following describes the present invention in detail.

The nylon 12 of the present invention is produced from ω-laurolactam and/or ω-aminododecanoic acid as the main component. Though the nylon 12 of the present invention can be produced from ω-laurolactam or ω-aminododecanoic acid alone, their copolymerized products with other lactams, aminocarboxylic acids, or polyamide-forming diamines and dicarboxylic acids or nylon salts composed thereof are also included in the present invention, with the proviso that they are 30% by weight or less of ω-laurolactam and/or ω-aminododecanoic acid.

Specific examples of the other lactam to be copolymerized include α-pyrrolidone, ε-caprolactam, ω-enantholactum, α-piperidone, ω-undecanlactam and the like. Illustrative examples of the other aminocarboxylic acid include 6-aminocapronic acid, 7-aminoheptanoic acid, 8-aminooctanoic acid, 9-aminononanoic acid, 10-aminocapric acid, 11-aminoundecanoic acid and the like.

Specific examples of the polyamide-forming diamine include tetramethylenediamine, pentamethylenediamine, hexamethylenediamine, heptamethylenediamine, octamethylenediamine, nonamethylenediamine, decamethylenediamine, undecamethylenediamine, dodecamethylenediamine, 2,2,4-trimethylhexamethylenediamine, 1,3-diaminocyclohexane, m-xylylenediamine, p-xylylenediamine and the like.

Specific examples of the polyamide-forming dicarboxylic acid include adipic acid, suberic acid, azelaic acid, sebacic acid, nonanedionic acid, decanedionic acid, undecanedionic acid, dodecanedionic acid, 1,2-cyclohexanedicarboxylic acid, terephthalic acid, isophthalic acid, naphthalenedicarboxylic acid and the like. These diamines and dicarboxylic acids are used in almost the same molar basis. Also, the nylon salt composed of such diamine and dicarboxylic acid is an equimolar salt of the diamine and dicarboxylic acid.

The other lactams, aminocarboxylic acids, or polyamide-forming diamines and dicarboxylic acids or nylon salts composed thereof to be used as the aforementioned copolymer components may be used alone or by optionally combining two or more of them, with the proviso that they are 30% by weight or less of ω-laurolactam and/or ω-aminododecanoic acid.

The nylon 12 of the present invention has a $\eta_r$ value of from 1.9 to 3.5, preferably from 2.1 to 3.3, and a MFR value of 0.1 g/10 min. or more, and the $\eta_r$ and MFR have the relationship represented by the formula (I).

When $\eta_r$ is larger than 3.5, the melt fluidity becomes poor which causes a difficulty in obtaining tubular molds, sheets and the like extrusion molds having excellent appearances. Also, when $\eta_r$ is smaller than 1.9, the melt fluidity may be excellent, but it becomes difficult to obtain satisfactory tubular molds because of poor shape-keeping ability of the extrusion molds at the time of extrusion molding. It also causes a problem of entailing poor creep characteristics and fatigue characteristics. In this connection, $\eta_r$ is a value to be used as a scale of the molecular weight of nylon 12, which is measured using Ubbelohde viscometer in 98% sulfuric acid at a concentration of 10 g/dm$^3$ and at 25° C.

When MFR is smaller than 0.1 g/10 min., the extrusion moldability becomes extremely poor to causes a difficulty in obtaining tubular molds, sheets and the like extrusion molds having excellent appearances. In this connection, M is a value measured at 235° C. under a load of 2,160 g, and its unit is g/10 min.

In addition, when $\eta_r$ and MFR are within the aforementioned ranges but the relationship between $\eta_r$ and MFR deviates from the range of the formula (I), extrusion moldability in tube molding and the like may be good, but creep characteristics and fatigue characteristics become poor.

The nylon 12 of the present invention can be produced by any production method, with the proviso that its $\eta_r$ and MFR have the aforementioned specific relationship. In consequence, a known polyamide producing apparatus can be used in the production of the nylon 12 of the present invention by either a batch or continuous production method. Examples of the apparatus eligible for use in the production include a batch type reaction vessel, a single or multiple vessel type continuous reaction apparatus, a tubular continuous reaction apparatus, a kneading reaction extruder and the like.

In a preferred production method of the nylon 12 of the present invention, a pre-polymerization step is carried out by using (ω-laurolactam and/or ω-aminododecanoic acid as monomers, if necessary adding water, a copolymerization component, a molecular weight adjusting agent and the like, and effecting ring-opening reaction and initial condensation polymerization under a melting and high or ordinary pressure conditions, and then a post-polymerization step is carried out to increase the molecular weight by effecting condensation polymerization under a melting and ordinary or a reduced pressure conditions. This method can be carried out either by a continuous system or a batch system.

The following illustratively describes a preferred example of the production method of the nylon 12 of the present invention, using ω-laurolactam as the starting material.

The pre-polymerization is carried out using predetermined amounts of ω-laurolactam and water at a polymerization temperature of from 270 to 320° C., preferably from 280 to 310° C., under an increased pressure and under such conditions that the polymerization temperature T, the pressure inside the polymerization system (to be referred to as "system pressure" hereinafter in some cases) P and the polymerization time t have a relationship of the following formula (II):

$$7.99 \times 10^5 \exp(-2.19 \times 10^{-2} T) \geq Pt \geq 5.64 \times 10^7 \exp(-4.24 \times 10^{-2} T) \qquad (II)$$

wherein unit of the polymerization temperature T is ° C., unit of the pressure P inside the polymerization system is kgf/cm$^2$ G, and unit of the polymerization time t is hour (hr). In this connection, the system pressure means mainly pressure of water vapor inside the polymerization reaction system.

The nylon 12 obtained by the pre-polymerization has a $\eta_r$ of from 1.01 to 1.8, preferably from 1.1 to 1.6. A $\eta_r$ value of smaller than 1.01 is not desirable, because it will prolong polymerization time of the post-polymerization step. After completion of the pre-polymerization, the nylon 12 of the present invention can be produced by carrying out post-polymerization for a predetermined period of time under ordinary pressure or a reduced pressure at a temperature of from 230 to 350° C., preferably from 240 to 320° C.

System pressure and polymerization time at the time of the post-polymerization are optionally decided depending on the $\eta_r$ value of nylon 12 to be produced. In general, the system pressure at the time of post-polymerization is from 10 Torr to ordinary pressure, and the polymerization time is 5 minutes or more.

When polymerization temperature of the pre-polymerization step is lower than 270° C., it becomes difficult to produce the nylon 12 of the present invention having the aforementioned specific relationship between $\eta_r$ and MFR, and the productivity is reduced due to prolonged pre-polymerization time. On the other hand, when it is higher than 320° C., side reaction and deterioration reaction are apt to occur at the time of polymerization, so that it becomes difficult to produce the nylon 12 of the present invention having the aforementioned specific relationship between $\eta_r$ and MFR, and coloring of the produced nylon 12 occurs. Also, when the relationship between the product of system pressure and polymerization time and the polymerization temperature does not satisfy the aforementioned formula (II) in the pre-polymerization step, it becomes difficult to produce the nylon 12 of the present invention having the aforementioned specific relationship between $\eta_r$ and MFR.

When temperature at the time of the post-polymerization is lower than 230° C., it becomes difficult to produce the nylon 12 of the present invention having the aforementioned specific relationship between $\eta_r$ and MFR, and the post-polymerization time is prolonged. On the other hand, when it is higher than 350° C., side reaction and deterioration reaction are apt to occur at the time of polymerization, so that it becomes difficult to produce the nylon 12 of the present invention having the aforementioned specific relationship between $\eta_r$ and MFR, and coloring of the produced nylon 12 occurs.

In producing the nylon 12 of the present invention, phosphorus compounds such as phosphoric acid, phosphorous acid, hydrophosphorous acid, pyrophosphoric acid, polyphosphoric acid or their alkali metal salts, alkaline earth metal salts and esters may be added as occasion demands, in order to accelerate polymerization or prevent deterioration at the time of polymerization. The amount of these phosphorus compounds to be added is within the range of from 50 to 3,000 ppm based on the nylon 12 to be produced.

As occasion demands, an amine, a carboxylic acid and the like may be added for the purpose of controlling molecular weight of the nylon 12 of the present invention or stabilizing its melt viscosity. Monofunctional and/or bifunctional amines and carboxylic acids can be used. Specific examples of the amine include laurylamine, stearylamine, benzylamine, 1,6-diaminohexane, 1,9-diaminononane, 1,11-diaminoundecane, 1,12-diaminododecane, m-xylylenediamine, p-xylylenediamine and the like.

Specific examples of the carboxylic acid include acetic acid, benzoic acid, lauric acid, stearic acid, butanedionic acid, hexanedionic acid, isophthalic acid, terephthalic acid and the like. The amount of these amines and carboxylic acids to be added is optionally decided depending on the $\eta_r$ value of the nylon 12 to be produced.

The nylon 12 composition which comprises (A) nylon 12 of the present invention and (B) a plasticizer is a composition necessary for achieving the object of the present invention. Also, a composition which comprises (A) nylon 12 of the present invention, (B) a plasticizer and (C) a modified polyolefin is another composition necessary for achieving the object of the present invention.

In the nylon 12 composition of the present invention, the plasticizer (B) to be used in the present invention is at least one compound selected from esters and alkylamides. The terms "esters" as used herein means phthalic acid esters, fatty acid esters, polyhydric alcohol esters, phosphoric acid esters, trimellitic acid esters and hydroxybenzoic acid esters. Specific examples of phthalic acid esters include dimethyl phthalate, diethyl phthalate, dibutyl phthalate, diheptyl phthalate, di-2-ethylhexyl phthalate, di-n-octyl phthalate, diisodecyl phthalate, ditridecyl phthalate, dicyclohexyl phthalate, butylbenzyl phthalate, diisononyl phthalate, ethylphthalylethyl glycolate, butylphthalylbutyl glycolate, diundecyl phthalate, di-2-ethylhexyl tetrahydrophthalate and the like.

Specific examples of fatty acid esters include dibasic saturated carboxylic acid esters such as dimethyl adipate, dibutyl adipate, diisobutyl adipate, dibutyldiglycol adipate, di-2-ethylhexyl adipate, di-n-octyl adipate, diisodecyl adipate, diisononyl adipate, an adipic acid di-n-mixed alkyl ester, dimethyl sebacate, dibutyl sebacate, di-2-ethylhexyl sebacate, di-2-ethylhexyl azelate, a di-2-ethylhexyl mixed acid ester and bis-2-ethylhexyl didodecanoate, and dibasic unsaturated carboxylic acid esters such as dibutyl fumarate, bis-2-methylpropyl fumarate, bis-2-ethylhexyl fumarate, dimethyl maleate, diethyl maleate, dibutyl maleate and bis-2-ethylhexyl maleate, as well as butyl oleate, isobutyl oleate, acetylbutyl recinolate, tributyl acetylcitrate, 2-ethylhexyl acetate and the like.

Specific examples of polyhydric alcohol esters include 2,2,4-trimethyl-1,3-pentanediol monoisobutyrate, 2,2,4-trimethyl-1,3-pentanediol diisobutyrate, diethylene glycol dibenzoate, triethylene glycol di-2-ethylbutyrate, pentaerythritol monooleate, pentaerythritol monostearate, pentaerythritol trialkyl ester, behenic acid monoglyceride, 2-ethylhexyl triglyceride, glycerol triacetate, glycerol tributyrate and the like.

Specific examples of phosphoric acid esters include trimethyl phosphate, triethyl phosphate, tributyl phosphate, tri-2-ethylhexyl phosphate, tributoxyethyl phosphate, triphenyl phosphate, n-octyldiphenyl phosphate, cresyldiphenyl phosphate, tricresyl phosphate, trixylenyl phosphate, 2-ethylhexyldiphenyl phosphate and the like.

Specific examples of trimellitic acid esters include tributyl trimellitate, tri-2-ethylhexyl trimellitate, tri-n-octyl trimellitate, triisononyl trimellitate, triisodecyl trimellitate, a trimellitic acid tri-mixed alcohol ester and the like.

Specific examples of hydroxybenzoic acid esters include ethylhexyl o- or p-hydroxybenzoate, hexyldecyl o- or p-hydroxybenzoate, ethyldecyl o- or p-hydroxybenzoate, octyloctyl o- or p-hydroxybenzoate, decyldodecyl o- or p-hydroxybenzoate, methyl o- or p-hydroxybenzoate, butyl o- or p-hydroxybenzoate, hexyl o- or p-hydroxybenzoate, n-octyl o- or p-hydroxybenzoate, decyl o- or p-hydroxybenzoate, dodecyl o- or p-hydroxybenzoate and the like.

The alkylamides are toluenesulfonic acid alkylamides or benzenesulfonic acid alkylamides. Specific examples of toluenesulfonic acid alkylamides include N-ethyl-o-toluenesulfonic acid butylamide, N-ethyl-p-toluenesulfonic acid butylamide, N-ethyl-o-toluenesulfonic acid 2-ethylhexylamide, N-ethyl-p-toluenesulfonic acid 2-ethylhexylamide and the like. Specific examples of benzenesulfonic acid alkylamides include benzenesulfonic acid propylamide, benzenesulfonic acid butylamide, benzenesulfonic acid 2-ethylhexylamide and the like. These plasticizers cited above may be used alone or by optionally combining two or more of them.

Among these plasticizers, phthalic acid esters such as dibutyl phthalate, diisodecyl phthalate and di-2-ethylhexyl phthalate, hydroxybenzoic acid esters such as ethylhexyl p-hydroxybenzoate and hexyldecyl p-hydroxybenzoate, and alkylamides such as benzenesulfonic acid butylamide and benzenesulfonic acid 2-ethylhexylamide are preferably used.

The modified polyolefin (C) to be used in the nylon 12 composition of the present invention as occasion demands is a block copolymer, a random copolymer or a graft copolymer which is obtained by copolymerizing an olefin consisting of ethylene and/or propylene as the main component with an α,β-unsaturated carboxylic acid or a derivative thereof. The modified polyolefin is synthesized by using an olefin monomer or polymer comprising ethylene and/or propylene as the main component. Specific examples of the copolymer of an olefin comprising ethylene and/or propylene as the main component (to be referred to as "polyolefin" hereinafter in some cases) include an ethylene-propylene copolymer, an ethylene-1-butene copolymer, an ethylene-1-hexene copolymer, an ethylene-4-methylpentene-1 copolymer, an ethylene-1-decene copolymer, an ethylene-1-dodecene copolymer and the like copolymers of ethylene with one or two or more α-olefins, and an ethylene-butylene-styrene copolymer, an ethylene-propylene-styrene copolymer, a styrene-ethylene-butylene-styrene copolymer, a styrene-ethylene-propylene-styrene copolymer and the like. Among these polyolefins, an ethylene-propylene copolymer, an ethylene-butylene-styrene copolymer, an ethylene-propylene-styrene copolymer, a styrene-ethylene-butylene-styrene copolymer and the like are preferably used.

Among these polyolefins, those which use ethylene as the main component having the ethylene content of generally from 30 to 90 mol %, preferably from 40 to 90 mol %, are used most preferably in view of the effect to improve flexibility and low temperature impact strength. When the ethylene content of these polyolefins is less than 30 mol %, glass transition temperature of the polyolefin becomes high so that the effect to improve low temperature impact strength becomes insufficient. Also, when it exceeds 90 mol %, crystallinity of these polyolefins becomes high so that the elastic property is lost and the flexibility and low temperature impact strength are reduced.

Specific examples of the α,β-unsaturated carboxylic acid or a derivative thereof to be copolymerized with a polyolefin comprising ethylene and/or propylene as the main component include monobasic unsaturated carboxylic acids such as acrylic acid, methacrylic acid, methyl methacrylate, crotonic acid and isocrotonic acid, dibasic unsaturated carboxylic acids such as maleic acid, fumaric acid, tetrahydrophthalic acid, itaconic acid, citraconic acid, endo-cis-bicyclo[2,2,1]hepto-5-ene-2,3-dicarboxylic acid, or derivatives of these monobasic or dibasic unsaturated carboxylic acids such as maleic anhydride, nadic anhydride, itaconic anhydride and the like acid anhydrides, acid halide, amide, imide, sodium salt, zinc salt and the like.

Block copolymers or random copolymers which are obtained by copolymerizing a polyolefin comprising ethylene and/or propylene as the main component with an α,β-unsaturated carboxylic acid or a derivative thereof can be produced by known olefin polymerization methods using a polyolefin comprising ethylene and/or propylene as the main component and an α,β-unsaturated carboxylic acid or a derivative thereof as the starting materials.

The α,β-unsaturated carboxylic acid or a derivative thereof is used preferably in an amount of from 0.01 to 30 mol % based on the polyolefin.

In the case of graft polymerization, there are known methods such as a method in which the aforementioned polyolefin comprising ethylene and/or propylene as the main component is melted or dissolved in a solvent, an α,β-unsaturated carboxylic acid or a derivative thereof and a radical generator are added to the thus melted or dissolved material and then the resulting mixture is heated with stirring to effect graft polymerization. Among these methods, a method in which graft polymerization of the aforementioned α,β-unsaturated carboxylic acid or a derivative thereof to a melted polyolefin is carried out using an extruder is most simple and efficient. In carrying out graft polymerization, graft polymers can be produced efficiently when a radical generator such as an organic peroxide or an azo compound is used. Examples of the radical generator include an organic peroxide, an organic per-ester and an azo compound. Specific examples of the organic peroxide, organic per-ester and the like include benzoyl peroxide, dichlorobenzoyl peroxide, dicumyl peroxide, cyclohexanone peroxide, di-tert-butyl peroxide, 2,5-dimethyl-2,5-di(peroxide benzoate)hexyne-3,1,4-bis(tert-butylperoxyisopropyl)benzene, lauroyl peroxide, tert-t-butyl peracetate, 2,5-dimethyl-2,5-di(tert-butylperoxy)hexyne-3, 2,5-dimethyl-2,5-di(tert-butylperoxy)hexane, tert-butyl perbenzoate, tert-butyl perphenylacetate, tert-butyl perisobutyrate, tert-butyl per-sec-octoate, tert-butyl perpivalate, cumyl perpivalate, tert-butyl perdiethylacetate and the like. Specific examples of the azo compound include azobisisobutyronitrile, dimethyl azoisobutyrate and the like.

Amount of the α,β-unsaturated carboxylic acid or a derivative thereof to be used in the graft polymerization is generally within the range of from 0.02 to 6% by weight based on the polyolefin comprising ethylene and/or propylene as the main component. If its amount does not fall within this range, it would cause poor miscibility with nylon 12 and therefore entail insufficient impact strength at low temperature.

When the nylon 12 composition of the present invention consists essentially of (A) nylon 12 of the present invention and (B) a plasticizer, their amounts to be blended are (A) 100 parts by weight of nylon 12 of the present invention and (B) from 1 to 25 parts by weight, preferably from 3 to 20 parts by weight, of the plasticizer. If the amount of the plasticizer is smaller than the lower limit, it would bear no sufficient effect to improve flexibility and low temperature impact strength. On the other hand, if the amount is larger than the upper limit, it would cause reduction of creep characteristics and heat resistance.

When the nylon 12 composition of the present invention consists essentially of (A) nylon 12 of the present invention, (B) a plasticizer and (C) a modified polyolefin, their amounts to be blended are (A) 100 parts by weight of nylon 12 of the present invention, (B) from 1 to 25 parts by weight, preferably from 3 to 20 parts by weight, of the plasticizer and (C) from more than 0 to 30 parts by weight, preferably from 1 to 25 parts by weight, more preferably from 3 to 25 parts by weight, of the modified polyolefin. If the amount of the modified polyolefin (C) is smaller than the just described lower limit, it would bear no sufficient effect to improve low temperature impact strength. On the other hand, if the amount is larger than the upper limit, it would cause reduction of creep characteristics.

Within such a range that the purpose of the present invention is not spoiled, the nylon 12 of the present invention or the nylon 12 composition of the present invention may be blended with an antioxidant such as a phenol-based, thioether-based, phosphite-based or amine-based compound; a heat resistance stabilizer such as an organic tin-based, lead-based or metal soap-based compound; a weather resistance improving agent such as a salicylate-based, benzophenone-based, benzotriazole-based, cyanoacrylate-based or metal complex salt-based ultraviolet ray absorbing compound; an anti-static agent such as an alkylamine, an alkylamide, an alkyl ether, an alkylphenyl ether, a glycerol fatty acid ester, a sorbitan fatty acid ester, an alkyl sulfonate, an alkylbenzene sulfonate, an alkyl sulfate, an alkyl phosphate, a quaternary ammonium salt or an alkylbetaine; an inorganic flame retardant such as red phosphorus, tin oxide, zirconium hydroxide, barium metaborate, aluminum hydroxide or magnesium hydroxide; an organic flame retardant such as a halogen-based, phosphoric ester-based, melamine-based or cyanuric acid-based compound; and a flame retardant assisting agent such as antimony trioxide; as well as a nucleating agent, an oil, a pigment, a dye and the like.

The method for obtaining the nylon 12 composition of the present invention is not particularly limited, and various well known methods can be used. Examples of such applicable methods include a method in which predetermined amounts of (A) nylon 12 of the present invention, (B) a plasticizer and, as occasion demands, (C) a modified polyolefin, as well as various additives, are mixed in advance using a V type blender, a tumbler or the like low rotation mixer or Henschel mixer or the like high rotation mixer, melt-kneaded using a single screw extruder, a twin screw extruder or a twin screw kneader and then made into pellets, and a method in which predetermined amounts of nylon 12 of the present invention (A) and, as occasion demands, a modified polyolefin (C) are mixed in advance using the just described low rotation mixer or high rotation mixer, melt-kneaded using a single screw extruder, a twin screw extruder or a twin screw kneader while injecting a plasticizer (B) into the cylinder of the melt kneader and then made into pellets. In this connection, it is desirable to employ the latter method when the plasticizer (B) is liquid at room temperature.

Since the nylon 12 of the present invention or the nylon 12 composition of the present invention is possessed of excellent moldability, particularly excellent extrusion moldability, it can be applied suitably to tubular molds, and extrusion molds of films, fibers, monofilaments and the like, and particularly suitable for fuel tubes, various tubes in the automobile engine room, gas pipes and the like tubular molds. These tubular molds are produced for example by using a general single screw extruder equipped with a straight die for tube use and a sizing former, carrying out the extrusion at a cylinder temperature of from the melting point of the nylon 12 of the present invention to 330° C., usually from 190 to 280° C., preferably from 200 to 280° C., and then cooling the extruded product with water or the like.

In addition, the nylon 12 of the present invention or the nylon 12 composition of the present invention can also be applied to the production of blow molds and deep-drawn box-like molds not only by extrusion molding but also by injection molding, blow molding, vacuum molding and the like well known molding methods.

EXAMPLES

The following describes the present invention further in detail based on Examples and Comparative Examples. However, the present invention is not restricted by these examples. In this connection, the characteristics shown in Examples 1 to 4 and Comparative Examples 1 to 4 were measured by the following methods.

(1) Measurement of relative viscosity ($\eta_r$)

Measured in accordance with JIS K 6810 using Ubbelohde viscometer at 25° C. after completely dissolving polyamide in 98% sulfuric acid used as the solvent at a concentration of 10 g/dm³.

(2) Measurement of melt flow rate (MFR)

Measured in accordance with JIS K 7210 at 235° C. under a load of 2,160 g. The unit is g/10 min.

(3) Measurement of creep characteristics

Both ends of a JIS No. 1 tensile test piece were cut off, and 80 mm in length of the central parallel part was used as a test piece and measured in the following manner using a creep tester (manufactured by Yasuda Seiki Seisaku-sho). The test piece was held between 40 mm chucks, and the creep test was carried out at a test temperature of 80° C. and under a load of 62 kg. The creep distortion value was obtained from the difference between the chuck-to-chuck distance at the time of the commencement of test and the chuck-to-chuck distance after 60 hours of the test. Smaller creep distortion value means superior creep characteristics.

(4) Measurement of fatigue characteristics

An ASTM No. 5 test piece (10 mm central parallel part) was used as the test piece, and a constant load tensile fatigue cycle test was carried out using an Instron 1341 type fatigue testing machine.

The fatigue test was carried out under conditions of 5 Hz in frequency, 360 N in load and 9,000 times in the number of cycles, and the permanent set at the time of the completion of the test was measured. Fatigue characteristics were evaluated by the permanent set at this stage. Shorter permanent set means superior fatigue characteristics.

Example 1

Using an apparatus for use in testing a two step continuous polymerization reaction which comprises a pre-polymerization step in which ω-laurolactam and water are heated under pressure to effect ring-opening reaction and initial stage condensation polymerization reaction and subsequent post-polymerization step in which condensation polymerization is carried out under ordinary pressure and/or a reduced pressure, ω-laurolactam containing 5% by weight of water was fed at a rate of 50 kg/hr to carry out pre-polymerization at a temperature of 285° C., under a water vapor pressure inside the polymerization system (to be referred to as system pressure hereinafter) of 33 kgf/cm²G and for a retention time (polymerization time, the same shall apply hereinafter) of 14 hours. Next, stearic acid was added as a terminal controlling agent to the thus obtained prepolymer in an amount of 1/300 mole based on the amount of the monomer to carry out post-polymerization at a temperature of 265° C., under a system pressure of 370 Torr and for a retention time of 6 hours, the resulting polymer was extruded in a strand shape under melting condition and cooled in a water tank and then the strand was cut and dried, thereby producing pellets of nylon 12. Results of the measurement of the thus obtained nylon 12 in terms of its $\eta_r$, MFR, creep distortion after creep test and permanent set after fatigue test are shown in Table 1. In this case, test pieces for use in the creep test and fatigue test were molded by injection molding at a resin temperature of 225° C. Also, a tube of 3 mm in outer diameter and 2 mm in inner diameter was molded by feeding the thus obtained nylon 12 pellets into a 40 mm φ single screw extruder (L/D=28, Model FS 40 manufactured by Ikegai) equipped with a straight die for tube use having a die/mandrel size of 7.8 mm/5.0 mm and a sizing former of 3.6 mm in inner diameter and 20 degrees in entrance angle, and drawing out the resulting polymer using a belt type drawing machine at a cylinder temperature of the single screw extruder of from 180 to 210° C., at a water temperature of a vacuum water tank of 10° C. and under a reduced pressure of from 10 to 400 mmHg. Drawing rate of the belt type drawing machine was set to 40 m/min, thereby obtaining a tube having almost completely round section.

Example 2

A 70 liter capacity batch polymerization reaction vessel was charged with 25 kg of ω-laurolactam and 5 kg of water to carry out 20 hours of pre-polymerization at a temperature of 300° C. under a pressure of 30 kgf/cm²G. Next, 1 hour of post-polymerization was carried out after reducing the temperature to 270° C. and returning the pressure to ordinary pressure. Results of the measurement of $\eta_r$, MFR, creep distortion after creep test and permanent set after fatigue test of the nylon 12 obtained under these conditions are shown in Table 1. Test pieces for use in the creep test and the like were obtained by the same method described in Example 1.

Comparative Example 1

The procedure of Example 1 was repeated, except that the pre-polymerization temperature was changed to 276° C. and the system pressure in the pre-polymerization step was changed to 29 kgf/cm²G. The product of system pressure and retention time at the time of this pre-polymerization was 406 which was smaller than the value $5.64 \times 10^7 \exp(-4.24 \times 10^{-2} \times 276) = 468$. The Results of the measurement of $\eta_r$, MFR, creep distortion after creep test and permanent set after fatigue test of the nylon 12 obtained under these conditions are shown in Table 1.

Also, using the nylon 12 obtained under these conditions, a tube of 3 mm in outer diameter and 2 mm in inner diameter was molded in the same manner as described in Example 1. A tube having almost completely round section was obtained at a drawing rate of the belt type drawing machine of 15 m/min, but the tube shape became elliptical when the drawing rate was increased to 20 m/min.

Comparative Example 2

The procedure of Example 1 was repeated, except that the pre-polymerization temperature was changed to 280° C., the system pressure in the pre-polymerization step was changed to 33 kgf/cm²G, and the polymerization time (retention time) in the pre-polymerization step was changed to 10 hours. The product of system pressure and retention time at the time of this pre-polymerization was 330 which was smaller than the value $5.64 \times 10^7 \exp(-4.24 \times 10^{-2} \times 280) = 394$. The Results of the measurement of $\eta_r$, MFR, creep distortion after creep test and permanent set after fatigue test of the nylon 12 obtained under these conditions are shown in Table 1.

TABLE 1

|  | Example 1 | Example 2 | Comparative Example 1 | Comparative Example 2 |
|---|---|---|---|---|
| $\eta_r$ | 2.44 | 2.54 | 2.45 | 2.46 |
| MFR (g/10 min) | 3.5 | 0.7 | 9.6 | 8.5 |
| Creep distortion | 0.26 | 0.21 | 0.48 | 0.44 |
| Permanent set after fatigue test (mm) | 3.7 | not measured | 6.1 | not measured |

Example 3

The procedure of Example 1 was repeated, except that the temperature and system pressure in the pre-polymerization step were changed to 290° C. and 35 kgf/cm²G, respectively, the amount of stearic acid as a terminal controlling agent was changed to 1/3,000 mole based on the monomer, and the temperature and system pressure in the post-polymerization step were changed to 268° C. and 300 to 270 Torr, respectively. The Results of the measurement of $\eta_r$, MFR, creep distortion after creep test and permanent set after fatigue test of the nylon 12 obtained under these conditions are shown in Table 2.

Example 4

The procedure of Example 1 was repeated, except that the temperature and system pressure in the pre-polymerization step were changed to 295° C. and 35 kgf/cm²G, respectively, the amount of stearic acid as a terminal controlling agent was changed to 1/1,000 mole, and the temperature and system pressure in the post-polymerization step were changed to 268° C. and 230 to 200 Torr, respectively. The Results of the measurement of $\eta_r$, MFR, creep distortion after creep test and permanent set after fatigue test of the nylon 12 obtained under these conditions are shown in Table 2.

Comparative Example 3

The procedure of Example 1 was repeated, except that the temperature and system pressure in the pre-polymerization step were changed to 276° C. and 29 kgf/cm²G, respectively, the amount of stearic acid as a terminal controlling agent was changed to 1/1,000 mole, and the temperature, system pressure and retention time in the post-polymerization step were changed to 255° C., 230 Torr and 4 hours, respectively. The Results of the measurement of $\eta_r$, MFR, creep distortion after creep test and permanent set after fatigue test of the nylon 12 obtained under these conditions are shown in Table 2.

Comparative Example 4

The procedure of Example 1 was repeated, except that the temperature, system pressure and retention time in the pre-polymerization step were changed to 280° C., 33 kgf/cm²G and 10 hours, respectively, the amount of stearic acid as a terminal controlling agent was changed to 1/1,000 mole, and the temperature, system pressure and retention time in the post-polymerization step were changed to 255° C., 230 Torr and 4 hours, respectively. The Results of the measurement of $\eta_r$, MFR, creep distortion after creep test and permanent set after fatigue test of the nylon 12 obtained under these conditions are shown in Table 2.

TABLE 2

|  | Example 3 | Example 4 | Comparative Example 3 | Comparative Example 4 |
|---|---|---|---|---|
| $\eta_r$ | 2.73 | 2.67 | 2.88 | 2.81 |
| MFR (g/10 min) | 0.9 | 1.3 | 2.9 | 2.8 |
| Creep distortion | 0.25 | 0.31 | not measured | 0.38 |
| Permanent set after fatigue test (mm) | 2.2 | not measured | 4.9 | not measured |

In this connection, the characteristics shown in Examples 5 to 9 and Comparative Examples 5 to 7 were measured by the following methods.

(1) Measurement of relative viscosity ($\eta_r$)

Measured in accordance with JIS K 6810 using Ubbelohde viscometer at 25° C. after completely dissolving polyamide in 98% sulfuric acid used as the solvent at a concentration of 10 g/dm³.

(2) Measurement of melt flow rate (MFR)

Measured in accordance with JIS K 7210 at 235° C. under a load of 2,160 g. The unit is g/10 min.

(3) Measurement of flexural modulus

Measured in accordance with ASTM D-790. Flexural modulus is a measure of flexibility, and smaller value means superior flexibility. In this case, test pieces were molded by injection molding at a cylinder temperature of 210° C. and a die temperature of 60° C.

(4) Measurement of creep characteristics

Both ends of a JIS No. 1 tensile test piece were cut off, and 80 mm in length of the central parallel part was used as a test piece and measured in the following manner using a creep tester (manufactured by Yasuda Seiki Seisaku-sho). The test piece was held between 40 mm chucks, and the creep test was carried out at a test temperature of 75° C. and under a load of 62 kg. The creep distortion value was obtained from the difference between the chuck-to-chuck distance at the time of the commencement of test and the chuck-to-chuck distance after 60 hours of the test. Smaller creep distortion value means superior creep characteristics. The JIS No. 1 tensile test piece was molded by injection molding at a cylinder temperature of 210° C. and a die temperature of 60° C. (5) Measurement of impact strength at low temperature In accordance with ASTM D256, this was measured at −40° C. using a notched test piece having a thickness of ½ inch after keeping it in a cooling vessel of −40° C. Test pieces were molded by injection molding at a cylinder temperature of 210° C. and a die temperature of 60° C.

(6) Production of nylon 12

(6)-1: Nylon 12 production example-1

The procedure of Example 1 was repeated, and the same nylon 12 as that produced in Example 1 was obtained. The thus produced nylon 12 showed a $\eta_r$ value of 2.44 and a MFR value of 3.5 g/10 min. The nylon 12 obtained in this production example is described as "PA 12-1" hereinafter.

(6)-2: Nylon 12 production example-2

A 70 liter capacity batch polymerization reaction vessel was charged with 24.75 kg of ω-laurolactam, 0.25 kg of ε-caprolactam and 5 kg of water to carry out 20 hours of pre-polymerization, at a polymerization temperature of 300° C. under a pressure of 30 kgf/cm²G. Next, 1 hour of post-polymerization was carried out after reducing the polymerization temperature to 270° C. and returning the pressure to ordinary pressure. The thus produced nylon 12 under these conditions showed a $\eta_r$ value of 2.54 and a MFR value of 0.7 g/10 min. The nylon 12 obtained in this production example is described as "PA 12-2" hereinafter.

(6)-3: Nylon 12 production example-3

This was carried out using the same apparatus and method as described in the aforementioned Nylon 12 production method-1 of (6)-1, except that the polymerization temperature, system pressure and polymerization time (retention time) in the pre-polymerization step were changed to 280° C., 33 kgf/cm²G and 10 hours, respectively, the amount of stearic acid as a terminal controlling agent was changed to 1/1,000 mole based on ω-laurolactam, and the polymerization temperature, system pressure and polymerization time (retention time) in the post-polymerization step were changed to 255° C., 230 Torr and 4 hours, respectively. The thus produced nylon 12 showed a $\eta_r$ value of 2.81 and a MFR value of 2.8 g/10 min. (this value is larger than $3.25 \times 10^4 \exp(-3.48 \eta_r)$ and therefore is outside the range of the formula (I)). The nylon 12 obtained in this production example is described as "PA 12-3" hereinafter.

(6) Production example of modified polyolefin

Using Henschel mixer, 100 parts by weight of an ethylene-propylene random copolymer having the ethylene content of 80 mol % and a MFR value of 1.2 g/10 min. when measured at 230° C., 1 part by weight of acetone, 0.8 part by weight of maleic anhydride and 0.025 part by weight of α,α'-bis-t-butylperoxy-diisopropylbenzene were mixed, and then the mixture was made into pellets by melt-kneading it at a resin temperature of from 230 to 240° C. using a single screw extruder having a cylinder diameter of 40 mm. The reacted amount of maleic anhydride was found to be 0.6% by weight based on an infrared spectrum analysis of the thus obtained pellets. The modified polyolefin thus obtained in this production example will be described as "m-EPR" hereinafter.

Examples 5 and 9 and Comparative Examples 5 to 7

Each of mixtures consisting of nylon 12, a plasticizer and a modified polyolefin blended at respective ratios shown in Table 3 was melt-kneaded at 230° C. and extruded in a strand shape using a twin screw kneader having a cylinder diameter of 40 mm, cooled in a water tank of 10° C. and then made into pellets using a pelletizer. Respective test pieces were prepared from the thus obtained pellets for the measurement of flexural modulus, low temperature impact strength and creep characteristics. Using these test pieces, flexural modulus, low temperature impact strength and creep characteristics were measured, with the results shown in Table 3.

In Table 3, abbreviations of plasticizers DOP means di-2-ethylhexyl phthalate, DIDP means diisodecyl phthalate and BSBA means benzenesulfonic acid butylamide. Also, m-EPR means a modified polyolefin obtained in the above described production example.

TABLE 3

| | (A) Nylon 12 | | (B) Plasticizer | | (C) Modified polyolefin | | Flexural modulus | Impact strength at low temp. | Creep distortion |
|---|---|---|---|---|---|---|---|---|---|
| Unit | Type | Amount wt. part | Type | Amount wt. part | Type | Amount wt. part | kg/cm² | kg · cm/cm | |
| Example 5 | PA 12-1 | 100 | DOP | 5 | m-EPR | 5 | 8500 | 14.7 | 0.25 |
| Example 6 | PA 12-1 | 100 | DIDP | 10 | m-EPR | 5 | 7300 | 20.2 | 0.33 |
| Example 7 | PA 12-1 | 100 | DIDP | 10 | — | 0 | 9000 | 19.0 | 0.30 |
| Example 8 | PA 12-2 | 100 | DOP | 15 | m-EPR | 10 | 5000 | 15.3 | 0.32 |
| | | | BSBA | 5 | | | | | |
| Example 9 | PA 12-2 | 100 | DIDP | 5 | m-EPR | 20 | 5100 | 22.2 | 0.35 |
| | | | BSBA | 5 | | | | | |
| Comparative Example 5 | PA 12-3 | 100 | — | 0 | — | 0 | 16000 | 6.0 | 0.41 |
| Comparative Example 6 | PA 12-3 | 100 | DOP | 5 | m-EPR | 5 | 9000 | 12.1 | 0.56 |
| Comparative Example 7 | PA 12-3 | 100 | DIDP | 10 | — | 0 | 8800 | 14.7 | 0.85 |

The nylon 12 having a $\eta_r$ value of from 1.9 to 3.5 and a MFR value of 0.1 g/10 min. or more, wherein the $\eta_r$ and MFR have a relationship of the above-described formula (I), has excellent extrusion moldability and creep characteristics, fatigue characteristics and the like mechanical properties and therefore is suited for tubular molds. Further, the nylon 12 composition which comprises (A) 100 parts by weight of the nylon 12 having the above-described specific relationship between $\eta_r$ and MFR, (B) from 1 to 25 parts by weight of a plasticizer, and (C) from 0 to 30 parts by weight of a modified polyolefin obtained from an olefin comprising ethylene and/or propylene as the main component and an α,β-unsaturated carboxylic acid or a derivative thereof has excellent flexibility, low temperature impact strength and creep characteristics and therefore is also suited for tubular molds.

What is claimed is:

1. A tubular molded product which is produced from nylon 12 having a relative viscosity of from 1.9 to 3.5 when measured in 98% sulfuric acid at a concentration of 10 g/dm³ and at 25° C. and a melt flow rate of 0.1 g/10 min. or more when measured at 235° C. under a load of 2,160 g, wherein said relative viscosity and said melt flow rate have a relationship of the following formula (I):

$$2.87 \times 10^3 \exp(-3.48 \eta_r) \leq MFR \leq 3.25 \times 10^4 \exp(-3.48 \eta_r) \quad (I)$$

wherein $\eta_r$ is relative viscosity and MFR is melt flow rate.

2. A tubular molded product which is produced from a nylon 12 composition which comprises:

(A) 100 parts by weight of nylon 12 having a relative viscosity of from 1.9 to 3.5 when measured in 98% sulfuric acid at a concentration of 10 g/dm$^3$ and at 25° C. and a melt flow rate of 0.1 g/10 min. or more when measured at 235° C. under a load of 2,160 g, wherein said relative viscosity and said melt flow rate have a relationship of the following formula (I):

$$2.87 \times 10^3 \exp(-3.48\, \eta_r) \leq \text{MFR} \leq 3.25 \times 10^4 \exp(-3.48\, \eta_r) \quad (I)$$

wherein $\eta_r$ is relative viscosity and MFR is melt flow rate;

(B) from 1 to 25 parts by weight of a plasticizer; and (C) from 0 to 30 parts by weight of a modified polyolefin obtained from an olefin comprising ethylene and/or propylene as the main component and an α,β-unsaturated carboxylic acid or a derivative thereof.

3. A tubular molded product formed by a method for producing nylon 12 which comprises performing a pre-polymerization step under a pressure melting condition and a subsequent post-polymerization step performed under ordinary pressure or a reduced pressure, wherein a polymerization temperature of the pre-polymerization step is within a range of from 270 to 320° C., and the polymerization temperature, a pressure inside a polymerization system and a polymerization time in the pre-polymerization step have a relationship of the following formula (II):

$$7.99 \times 10^5 \exp(-2.19 \times 10^{-2}\, T) \geq Pt \geq 5.64 \times 10^7 \exp(-4.24 \times 10^{-2}\, T) \quad (II)$$

wherein T is the polymerization temperature and its unit is ° C., P is the pressure inside the polymerization system and its unit is kgf/cm$^2$G, and t is the polymerization time and its unit is hour (hr).

4. The tubular molded product according to claim 2, wherein the plasticizer (B) is at least one compound selected from the group consisting of esters and alkylamides.

* * * * *